United States Patent
Lim et al.

(10) Patent No.: US 8,110,447 B2
(45) Date of Patent: Feb. 7, 2012

(54) METHOD OF MAKING AND DESIGNING LEAD FRAMES FOR SEMICONDUCTOR PACKAGES

(75) Inventors: Lay Yeap Lim, Penang (MY); David Chong, Penang (MY)

(73) Assignee: Fairchild Semiconductor Corporation, South Portland, ME (US)

( * ) Notice: Subject to any disclaimer, the term of this patent is extended or adjusted under 35 U.S.C. 154(b) by 426 days.

(21) Appl. No.: 12/052,871

(22) Filed: Mar. 21, 2008

(65) Prior Publication Data

US 2009/0236711 A1     Sep. 24, 2009

(51) Int. Cl.
 *H01L 21/00*     (2006.01)
(52) U.S. Cl. ......................................... 438/124; 257/676
(58) Field of Classification Search .................. 438/123, 438/124; 257/666, E23.031
See application file for complete search history.

(56) References Cited

U.S. PATENT DOCUMENTS

| | | | | |
|---|---|---|---|---|
| 5,784,262 A * | 7/1998 | Sherman | | 361/777 |
| 6,025,640 A * | 2/2000 | Yagi et al. | | 257/666 |
| 7,129,116 B2 | 10/2006 | Islam et al. | | |
| 7,169,651 B2 * | 1/2007 | Park et al. | | 438/124 |
| 7,687,893 B2 * | 3/2010 | Smith | | 257/676 |
| 2006/0214308 A1 * | 9/2006 | Yu et al. | | 257/778 |
| 2009/0280603 A1 * | 11/2009 | Qiao et al. | | 438/124 |

* cited by examiner

*Primary Examiner* — Thao Le
*Assistant Examiner* — Kimberly Trice
(74) *Attorney, Agent, or Firm* — Cesari and McKenna, LLP; Edwin H. Paul

(57) ABSTRACT

A lead frame with patterned conductive runs on the top surface to accept a wire bonded or flip-chip or COL configuration is disclosed. The top pattern is completed and the bottom is etched away creating cavities. The cavities are filled with a pre-mold material that lend structural support of the lead frame. The top is then etch through the lead frame to the pre-mold, except with the top conductive runs exist. In this manner the conductive runs are completed and isolated from each other so that the placement of the runs is flexible. The chips are mounted and the encapsulated and the lead frames are singulated. The pattern on the top and the bottom may be defined by first plated the patterns desired.

7 Claims, 3 Drawing Sheets

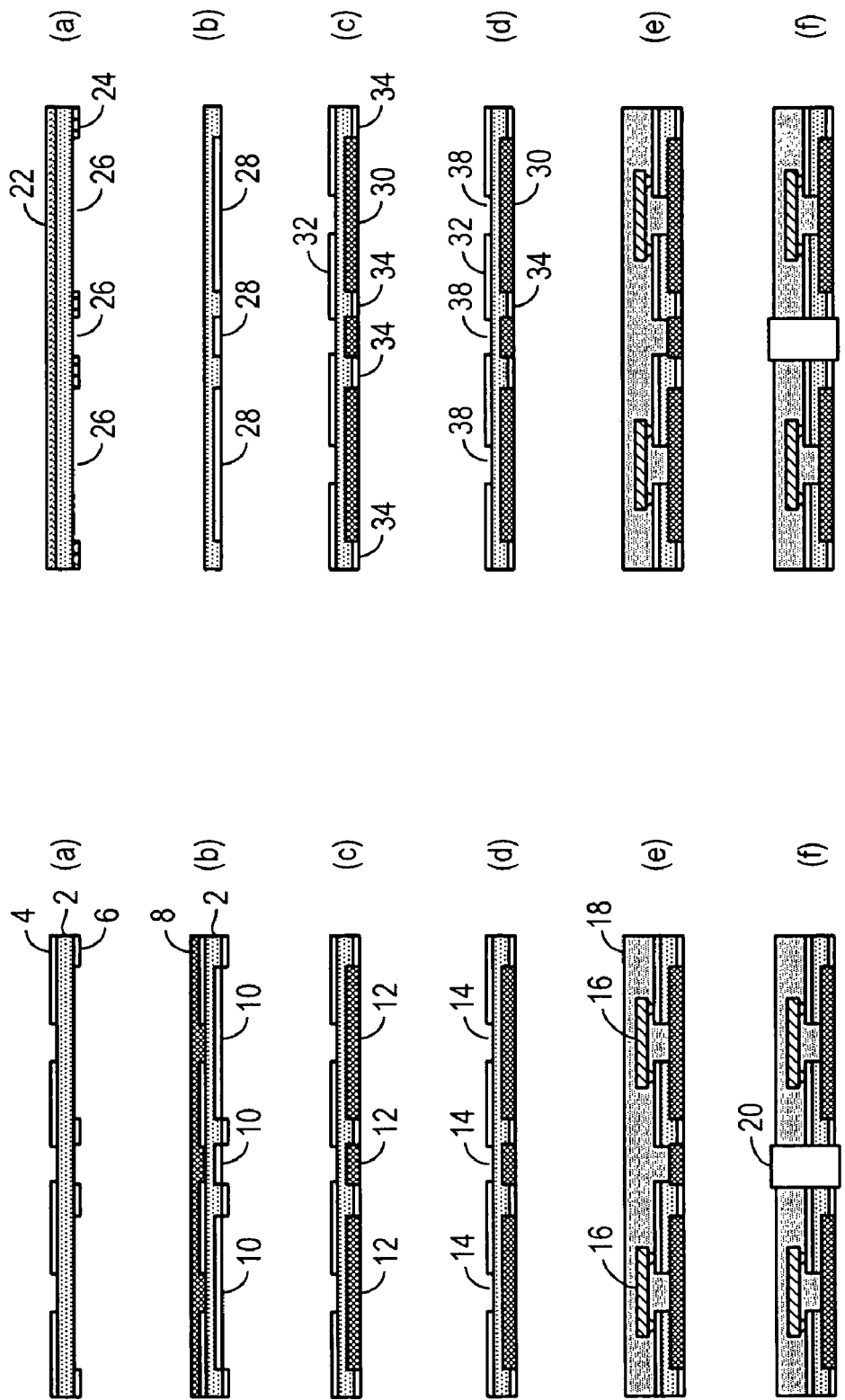

METHOD OF MAKING AND DESIGNING LEAD FRAMES FOR SEMICONDUCTOR PACKAGES

BACKGROUND OF THE INVENTION

1. Field of the Invention

The present invention relates to designing lead frames for ICs (integrated circuits), and more particularly to partial or half etching techniques that provide a stable patterned lead frame that improves reliability for the resultant encapsulated packaged IC.

2. Background Information

Traditional lead frames for ICs accept wire bonds between the chip and the lead frame or accept the chip directly (flip chip or COL, chip on a lead). The chip is attached to the lead frame and encapsulated forming an assembly that is then separated from other assemblies. The lead frame completes the electrical connections from the chip to the outside world beyond the encapsulation.

One continuing problem is the lead frame included etched leads that must be electrically isolated from all the other leads coming from an IC. This need results in very thin, flimsy leads that lack structural rigidity and are difficult to hold in place for either wire bonding or flip chip bonding. In addition the lead frames for many ICs are usually handled in groups for efficiency, but the lead frame connections between the individual lead frames must be cut or singulated. This singulation is accomplished by cutting with a saw, and sawing leads to quality problems, e.g., delamination, etc. Reliability is reduced and costs in time and money are increased.

One approach to the above problems is found in U.S. Pat. No. 7,129,116 ('116) to Islam et al. This '116 patent is incorporated herein by reference. The '116 patent pre-etches a pattern on the lead frame but does not etch through the lead frame. The result is an interconnected web of leads that are more rigid structure supporting the IC while making either wire or flip chip bonds. The many interconnections on the web lend structural support, but many must be later removed to break the many short circuits between the electrical leads. Later, after encapsulation, the other side of the lead frame is etched to isolate the leads from each other, and the same etching can accommodate singulation by removing metal connecting the lead frames from each other.

One limitation of the '116 patent is that the metal interconnected web restricts where the etched leads may run with respect to the chip and where the other leads may run. For example, since the web is of the metal it may be inconvenient, difficult or impossible to design long runs beneath the IC or runs that cross each other. The support short circuits may get in the way.

Herein as would be understood by those skilled in the art, the terms, "lead" and "run" are terms of art that may be used herein interchangeably to refer to the etched conductive "paths" that electrically connect one point to another on the lead frame.

The present invention is directed to the above mentioned and other limitations of the prior art.

SUMMARY OF THE INVENTION

The present invention provides etching a pattern onto a lead frame from the bottom and from the top where an IC will be mounted. Cavities are formed by the bottom etching that do not penetrate through the lead frame. These cavities may then be filled with a pre-mold material. Then, illustratively, the top surface is etched to a designed pattern. However, in contrast to prior art, the top is etched completely through the lead frame to the pre-mold material. This etching may be used to remove the lead frame material that joins several lead frames to each other. This removes any metal joining the lead frames to each other and accommodates later singulation. In such an instance the pre-mold material provides the structural rigidity and stability to the lead frames.

The IC may be mounted with epoxy (or some other adhesive) to the lead frame, wire or solder bonds made between to the IC and the lead frame and the assembly then encapsulated. The individual lead frames may then be singulated where only molding material must be cut.

The present invention provides for the electrical connections of the lead frame to be completed before the IC is mounted. This advantageously allows a flexibility of locating the lead frame runs not found in the prior art, where the electrical isolation of the lead frame runs is accomplished after the IC is mounted.

In one illustrative embodiment, the lead frame may be pre-plated with a desired pattern and the lead frame etched away around the pre-plated pattern or the desired pattern may be directly etched into the lead frame. However, in either case the final lead frame pattern of the top and the bottom of the lead frame is completed before mounting the IC.

Reiterating the present invention provides an advantage in the flexibility of locating the etch leads on the lead frame.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 1 is section view of a lead frame as it is processed by the present invention;

FIG. 2 is another section view of a lead frame being processed;

DETAILED DESCRIPTION OF AN ILLUSTRATIVE EMBODIMENT

Figure 3:
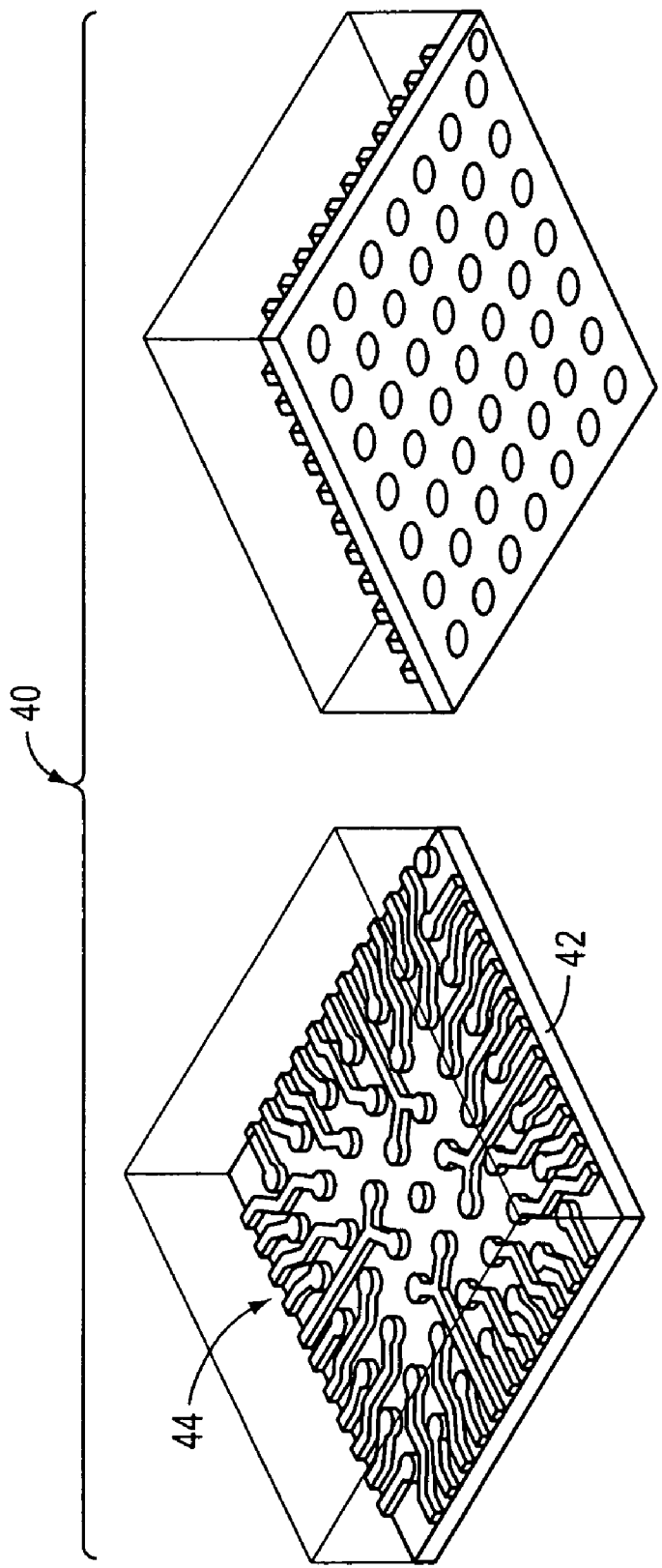
FIG. 3 is a top and bottom view of one example of an inventive lead frame.

FIG. 1 illustrates one process incorporating the present invention. Here, in step a, a lead frame 2 is plated with an electrical conductor on the top 4 and the bottom 6. The top 4 is etched to form runs on the top that represent the final runs desired in the lead frame as a completed IC package. The bottom is etched 6 to form opening wide enough to accommodate later etching of cavities that separate multiple lead frames and provide a location for a pre-mold that will adequately support the lead from for later fabrication steps. In step b, the top is covered with a photo-resist 8 and the bottom is etched 10 away to form cavities that go half way through the lead frame 2.

In step c, the cavities 10 are then filled with a pre-mold material 12 that when solid form a strong assembly with the lead frame and the photo-resist 8 is removed. The pre-mold material may be any that are well known in the field.

Still viewing FIG. 1, in step d, the top is etched 14 completely through the lead frame exposing the pre-mold material.

In step e, the dies 16 are attached, typically with epoxy, to the lead frame assembly. Wire bonds may be attached between the chip and the lead frame runs, and the chips encapsulated with a final mold material 18. At step f, the chips are separated 20 or singulated by known methods, e.g., sawing.

FIG. 2 illustrates another process incorporating the present invention. The difference between FIG. 1 and FIG. 2 is that the lead frame in FIG. 2 is not pre-plated with the designed runs on the top. Instead the top is coated with photo-resist and the bottom is coated with a pattern of photoresist 24 that exposes 26 sections of the lead frame. If the same chip were to be mounted to the lead frame of FIG. 2 as were mounted to the lead frame of FIG. 1, the resulting cavities will be the same in either case. Thus the bottom 26 looks similar to the bottom 6 in FIG. 1. In step b, the bottom is etched forming cavities 28 that extend half way through the lead frame. The photoresist is stripped away. In step c, pre-mold material 30 fills the cavities and the desired pattern 32 of conductive runs is formed on the top. The exposed lead frame bottom areas are plated 34.

In step d, the surface between the top runs 32 is etched through to the pre-mold material 30 earlier placed in the bottom cavities. Steps e and f of FIG. 2 are the same as steps e and f for FIG. 1. The chip is attached (epoxy or a compatible glue, etc.) to the lead frame, electrical contacts are made between the chip and the lead frame (wire contacts or flip chip electrical solder, etc.) and the entire assembly encapsulated. Multiple lead frames are separated in step f.

Since the etched runs on the top surface of the lead frame are isolated from those on the bottom, the bottom layer of conductive material can be patterned so that a dual layered lead frame may be constructed. Moreover, the lead frame may have parallel sets of isolated contacts.

FIG. 3 illustrates an arrayed package 40. The top 42 illustrates the variety of conductive runs 44.

Figure 4:
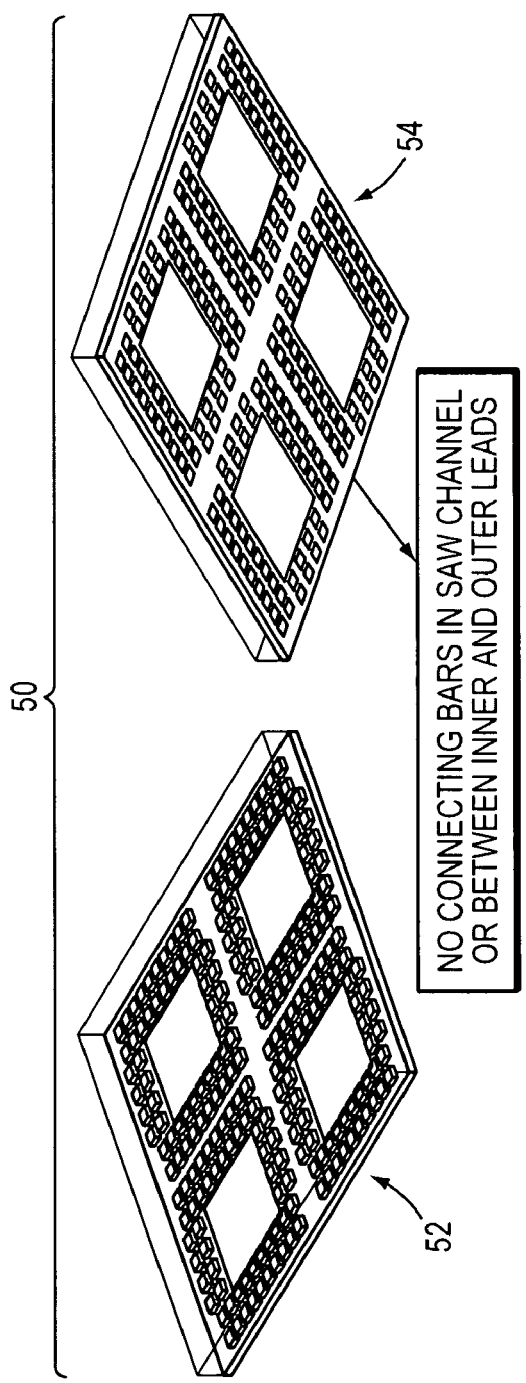
FIG. 4 is a top and bottom view of another inventive lead frame.

FIG. 4 illustrates the top 52 and the bottom 54 of a multi-row lead design. Since the conductive runs are formed and isolated from each other, no extra lead isolation is required and separation of the lead frames does not entail cutting metal.

Figure 5:
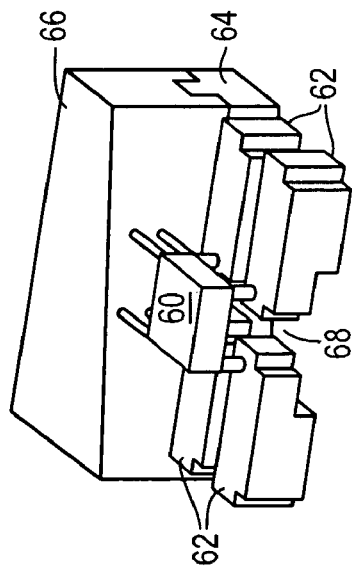
FIG. 5 is a view of a flip chip assembled on an inventive lead frame.

FIG. 5 illustrates in a cut away-type drawing, the present invention mounting flip chips or COL (Chip On Lead) integrated circuits. The chip 60 has connections to the exposed leads 62. The pre-mold material is shown 64 and the final mold that encapsulated the assembly is shown 66. Note the large cavity 68 below the chip that allows mold material to fill beneath the chip.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A process for fabricating electronic packages containing a chip, the process comprising the steps of:
    patterning the bottom surface of a lead frame, the bottom surface being the opposite side of the lead frame from where the chip is mounted;
    etching the bottom surface in accordance with the bottom pattern, wherein a cavity in the bottom surface of the lead frame is formed by the etching;
    filling the bottom surface cavity with a pre-mold material;
    etching the top surface of the lead frame in accordance with a top pattern forming electrical conductive runs;
    etching the top surface between the runs, wherein the etching creates a top cavity that extends through the thickness of the lead frame to the pre-mold material, wherein the runs on the top surface are isolated and located to accommodate electrical connections to the chip; and thereafter:
    mounting the chip to the top surface of the lead frame;
    making electrical connections between the chip and the lead frame; and
    encapsulating the chip and lead frame.

2. The process of claim 1 further comprising the step of separating each encapsulated chip and lead frame from one another.

3. The process of claim 1 wherein the step of patterning the bottom and top surface comprises the step of plating the top and the bottom surfaces, wherein the plating defines the patterns on the top and the bottom surfaces.

4. The process of claim 1 wherein the top surface pattern accommodates multi-rows of contacts to accommodate multi leaded configurations.

5. The process of claim 1 wherein the top surface pattern accommodates flip or chip on lead chips, and wherein the step of making electrical connections between the chip and the lead frame includes forming solder connections between the chip and the lead frame.

6. The process of claim 1 wherein the top surface pattern accommodates pin out for arrayed packages.

7. The process of claim 1 wherein the step of making electrical connections between the chip and the lead frame includes making wire bonds between the chip and the lead frame.

* * * * *